United States Patent [19]
Walker et al.

[11] Patent Number: 5,420,523
[45] Date of Patent: May 30, 1995

[54] APPARATUS AND METHOD FOR MEASURING PERFORMANCE PARAMETERS OF ELECTRIC MOTORS

[75] Inventors: Joel B. Walker, Athens; Stanley E. Wallace, Bogart, both of Ga.; Harjit S. Saini, South Russell, Ohio; Chester J. Cobosco, Athens, Ga.

[73] Assignee: Reliance Industrial Company, Cleveland, Ohio

[21] Appl. No.: 986,149

[22] Filed: Dec. 4, 1992

[51] Int. Cl.$^6$ ............................................. G01R 1/04
[52] U.S. Cl. ...................................... 324/772; 324/545
[58] Field of Search ............... 324/158 MG, 772, 546, 324/547, 558

[56] References Cited

U.S. PATENT DOCUMENTS 5,049,815 9/1991 Kliman ..................... 324/158 MG

*Primary Examiner*—Kenneth A. Wieder
*Assistant Examiner*—Barry Bowser
*Attorney, Agent, or Firm*—Jones & Askew

[57] ABSTRACT

There is disclosed an apparatus and method for determining locked rotor test data for three-phase alternating current motor without mechanically coupling the rotor to any instrumentality. The "locked rotor" test is conducted by connecting a source of single-phase alternating current with a variable frequency to the field windings of a three-phase a.c. motor. The frequency of the voltage source is varied from approximately the rated frequency to a lower frequency and the input electrical power and the input voltage are recorded at two or more data points defined by two or more frequencies between the rated frequency and 0. The single-phase input power data and the single-phase input voltage data is then scaled by a scaling factor to convert it to equivalent three-phase locked rotor data. Particularly, the single-phase input power is multiplied by 1.515 to convert it to equivalent three-phase input power, and the single-phase input voltage is multiplied by 0.860 to convert it to equivalent three-phase input voltage. By carrying out conventional stray load loss testing using a dynamometer off-line, by using a conventional no load test, and by measuring the d.c. resistance of the primary field windings, that data along with the single-phase "locked rotor" data can be used in an "Equivalent Circuit Method" calculation disclosed in *Japanese Standard JEC*-37 (1979) to determine the number of performance parameters for the three-phase a.c. motor.

17 Claims, 2 Drawing Sheets

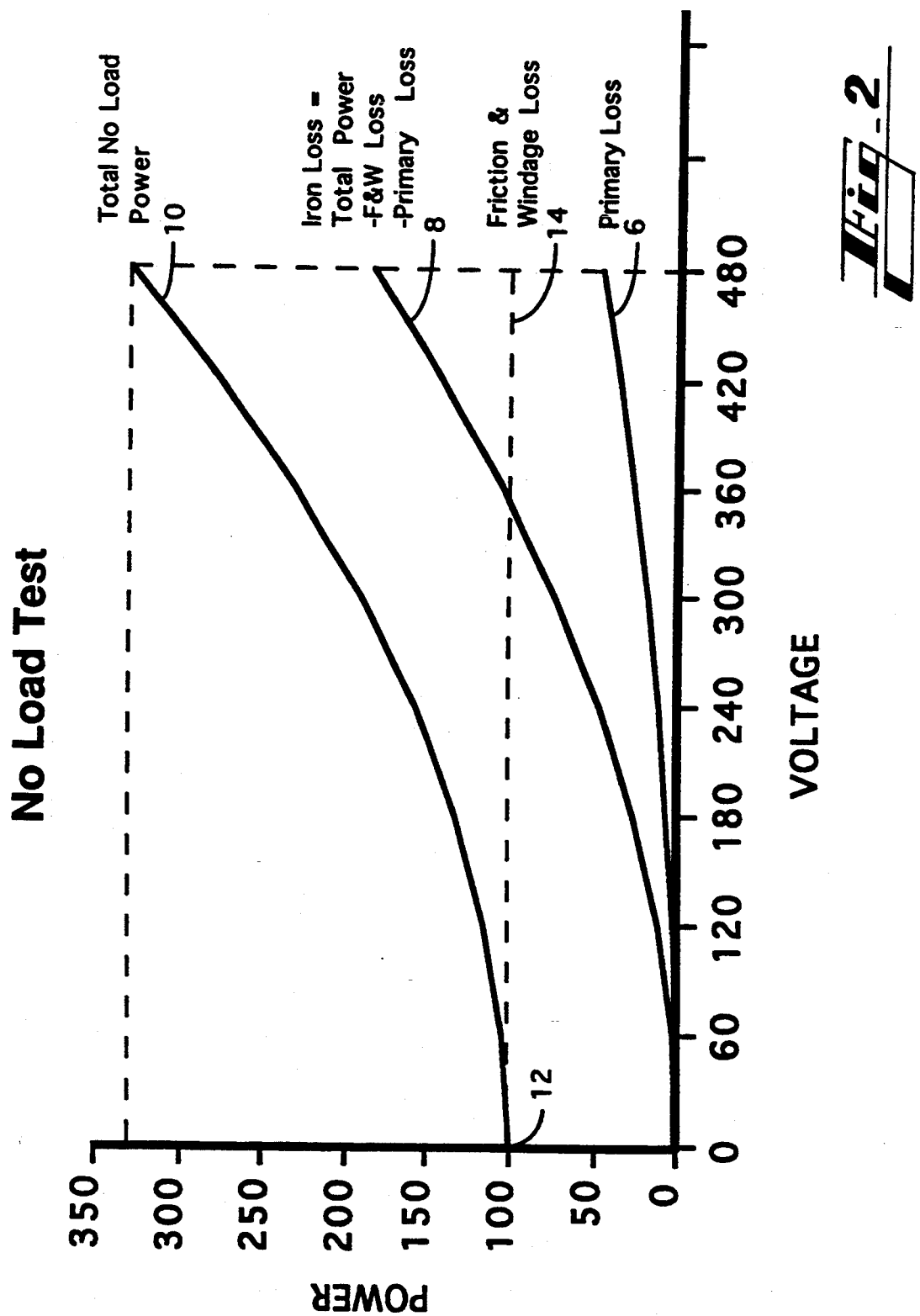

APPARATUS AND METHOD FOR MEASURING PERFORMANCE PARAMETERS OF ELECTRIC MOTORS

BACKGROUND OF THE INVENTION

This invention relates generally to an apparatus and method for testing a three-phase alternating current (a.c.) electric motor during production and more particularly concerns an apparatus and method for determining the performance parameters of a three-phase a.c. electric motor without the necessity of mechanically coupling the shaft of the electric motor to a dynamometer or other instrumentality during the on-line production test procedure.

In connection with the testing of a three-phase a.c. electric motor, there are a number of performance parameters that characterize the operation of such three-phase a.c. electric motor. Those parameters may include the following full load operating parameters: Efficiency, input current, input power, output power, output torque, speed, slip, power factor, iron (hysteresis) power loss, secondary rotor power loss, primary winding power loss, stray load power loss, and friction and windage power loss.

One performance parameter of a three-phase a.c. electric motor is its efficiency. Efficiency of an electric motor is the percentage of mechanical output power at the shaft of the electric motor as compared to the electrical input power for the electric motor. Such efficiency as well as other performance parameters are conventionally determined by coupling the shaft of the electric motor under test to a dynamometer and measuring the mechanical output power with the dynamometer and measuring the electrical input power with a power meter while the electric motor is running at various loads up to its rated full load. While testing the efficiency and other performance parameters of an electric motor using a dynamometer is well known and accepted in the art, such dynamometer testing does not lend itself to testing the efficiency of each and every three-phase a.c. electric motor on-line during the manufacturing process. Particularly, efficiency testing using a dynamometer not only requires the expense of an on-line dynamometer but also involves the additional time required to mechanically couple the motor under test to the dynamometer.

Another way of determining the efficiency and other performance parameters of a three-phase a.c. electric motor is to determine those performance parameters by means of the "Equivalent Circuit Method" for testing three-phase a.c. electric motors as set forth in *Japanese Test Standard JEC*-37 (1979), Section 8.5 which is incorporated herein by reference. The performance parameters are calculated in accordance with the "Equivalent Circuit Method" from the direct current (d.c.) resistance of the field windings of the motor, from the data gathered from a conventional no load test (described in Section 7 of *Japanese Test Standard JEC*-37 (1979)), from the data gathered from a conventional locked rotor test (described in Section 6 of *Japanese Test Standard JEC*-37 (1979)), and from the stray load power loss of the motor.

With regard to the d.c. resistance of the primary or field windings of the three-phase a.c. electric motor, the d.c. resistance can be determined by the following two steps: (1) Measure the d.c. resistance of the primary winding while the winding is at a known temperature; and (2) adjust the measured d.c. resistance to final full load operating temperature by multiplying the measured d.c. winding resistance by the ratio of (234.5+design operating temperature) / (234.5+known temperature) for copper windings or (225+design operating temperature) / (225+known temperature) for aluminum windings. From the d.c. resistance of the field windings a full load primary winding power loss can be calculated by multiplying the square of the full load input current by the d.c. resistance of the field windings.

In the conventional no load test, the motor is connected to a source of a.c. voltage and operated with the motor shaft unconnected to any external load. Three data points are taken at approximately 100%, 50%, and 35% of rated voltage. For each data point, the input power is measured and recorded. These data points are use to obtain the friction and windage power loss as described below and to provide the no load data points (100% and 50%) required in calculating certain performance parameters.

In the conventional locked rotor test, the motor's shaft is mechanically locked to prevent rotation. A reduced a.c. voltage, at the rated frequency, generally 60 Hz, is connected to the field windings to produce the rated current in the field windings. The electrical input power and input voltage are measured and recorded. The frequency of the input voltage is then reduced to between 15 Hz and 20 Hz, and the electrical input power and input voltage are measured and recorded again. These two data points are also used in the "Equivalent Circuit Method" for calculating certain performance parameters.

The full load stray load power loss is the loss which cannot be accounted for in any of the other losses (i.e. friction and windage power loss, primary power loss, secondary rotor power loss, and iron (hysteresis) power loss) and is therefore required in order to calculate other performance parameters of the motor accurately. The stray load power loss is in essence a characteristic of the motor design and is determined in conventional fashion using a dynamometer. The full load stray load power loss, once determined using a dynamometer on the motor, can then be used as a constant for a particular motor design in subsequent testing of other motors of the same design without the further need for dynamometer testing.

From the test data generated by the no load test, the friction and windage power loss, one of the performance parameters, can be determined. Obviously, all the power needed to run the motor at no load is lost. As the input voltage approaches zero the input power approaches the value of the friction and windage power loss. In addition, the no load data along with the primary winding power loss forms a basis for determining the iron (hysteresis) power loss for the motor. Graphically, the calculation of the friction and windage power loss and the iron (hysteresis) power loss can be represented by plotting the no load data points on a graph having power along the y-axis and voltage along the x-axis. The resulting plot can then be extrapolated to intersect the y-axis. The value of the intersection of the y-axis represents the friction and windage power loss. The iron (hysteresis) power loss is the difference between the no load electrical input power at the rated voltage and the friction and windage power loss minus the primary power loss at the rated no load input voltage.

Secondary rotor power loss is a performance parameter that may be of interest in evaluating the performance of a three-phase a.c. motor. The secondary rotor power loss is the loss resulting from the d.c. resistance of the rotor. In a three-phase a.c. motor with a squirrel-cage rotor, the secondary d.c. resistance cannot be measured directly. Because the secondary d.c. resistance and slip are related, the conventional method of obtaining full load secondary rotor power loss is determined by using the equation:

$$2ndIIR = slip \times (INPW - F\&W - Fe - PriIIR)$$

where:
slip = (sync. rpm − full load rpm)/sync. rpm;
INPW = total input power in watts at full load;
F&W = friction and windage power loss;
Fe = full voltage iron (hysteresis) power loss; and
PriIIR = full load primary winding power loss.

Several other performance parameters can also be calculated from the no load data, the locked rotor data, the stray load loss data, and the d.c. resistance of the primary field windings using the "Equivalent Circuit Method". The performance parameters calculated from the collected data includes: Efficiency, full load input current, full load input power, full load output power, full load output torque, speed, power factor, iron (hysteresis) power loss, friction and windage loss, the primary winding power loss, and secondary rotor power loss.

While it can be seen that the efficiency and other performance parameters of a three-phase a.c. electric motor can be determined by using the data from off-line stray load loss testing, from no load testing, from locked rotor testing, and from determination of the d.c. resistance of the primary field windings, the necessity of mechanically locking the rotor of the motor in order to perform the locked rotor test is undesirable for on-line testing of electric motors during the manufacturing process where each and every motor is to be tested for efficiency as well as other performance parameters.

SUMMARY OF THE INVENTION

It is therefore an object of the present invention to provide an apparatus and method for conducting a single-phase "locked rotor" test on a three-phase a.c. electric motor without mechanically coupling the shaft of the motor to an external instrumentality.

It is further an object of the present invention to provide an apparatus and method for conducting a single-phase "locked rotor" test using single-phase a.c. voltage and then mathematically converting the data from the single-phase "locked rotor" test to data that is comparable to data from a conventional locked rotor test using three-phase a.c. voltage.

It is also an object of the present invention to provide an apparatus and method for on-line testing and determination of the performance parameters of a three-phase a.c. electric motor without mechanically coupling the shaft of the motor to any instrumentality.

It is particularly an object of the present invention to provide an apparatus and method for on-line testing and determination of efficiency, full load input current, full load input power, full load output power, full load output torque, speed, power factor, iron (hysteresis) power loss, friction and windage loss, the primary winding power loss, and secondary rotor power loss of a three-phase a.c. electric motor without mechanically coupling the shaft of the motor to any instrumentality.

The foregoing objectives are achieved by a test apparatus and method which first determines the full load stray power loss off-line for a particular design of a three-phase a.c. electric motor in connection with a standard dynamometer test of the motor. With the stray load power loss characteristic having been predetermined off-line for a particular motor design, each electric motor during production is tested on-line to determine the d.c. resistance of the primary field windings. In addition, each motor is tested on-line, using the conventional no load test described in Section 7 of *Japanese Test Standard JEC*-37 (1979), to establish no load data points for the "Equivalent Circuit Method" calculations.

In accordance with the present invention, the data points required from the locked rotor test for the "Equivalent Circuit Method" calculations are determined by using a single-phase "locked rotor" test. Instead of a conventional locked rotor test, where the rotor is mechanically locked to prevent rotation, the locked rotor data points required for the "Equivalent Circuit Method" calculations are obtained in accordance with the present invention by using a single-phase a.c. voltage source connected to the field windings. Because the single-phase a.c. voltage source does not provide a rotating electric field that occurs with three-phase a.c. voltage source, there is no motive force created to turn the rotor. The rotor is thus "locked" by the single-phase alternating current in the field windings produced by the a.c. voltage source. With the rotor electrically "locked" by the single-phase a.c. voltage, the single-phase a.c. voltage is set at the rated frequency, generally 60 Hz, and is adjusted to produce rated full load current in the field windings. The electrical input power and input voltage are then measured and recorded for a first data point at 60 Hz. The single-phase a.c. voltage is reset to a lower frequency, generally between 15 and 20 Hz, and is readjusted to produce rated full load current in the field windings. The electrical input power and input voltage are again measured and recorded for a second data point at the lower frequency. The values of single-phase input power and input voltage for the data points are then scaled to convert them to scaled three-phase input power and voltage.

The scaling factors for input power and input voltage were previously determined by comparing and correlating measurements taken using data from a number of single-phase "locked rotor" tests and from conventional three-phase locked rotor tests. Particularly, the scaling factor for the single-phase power was found to be 1.515 (single-phase power × 1.515 = three-phase power), and the scaling factor for the single-phase voltage was found to be 0.860 (single-phase voltage × 0.860 = three-phase voltage). Using the scaled single-phase power data at 60 Hz and 20 Hz, along with the primary winding resistance, stray load loss and the no load data points, the performance parameters, such as efficiency, full load input current, full load input power, full load output power, full load output torque, speed, power factor, iron (hysteresis) power loss, friction and windage loss, the primary winding power loss, and secondary rotor power loss can be determined and, if desired, compared to predetermined limits.

Other objects and advantages of the invention will become apparent upon reading the following detailed description and upon reference to the drawings.

BRIEF DESCRIPTION OF THE DRAWINGS

FIG. 2 is a graph showing the relationship between iron (hysteresis) power loss and friction and windage power loss in connection with the no load test.

DETAILED DESCRIPTION OF THE INVENTION

Figure 1:
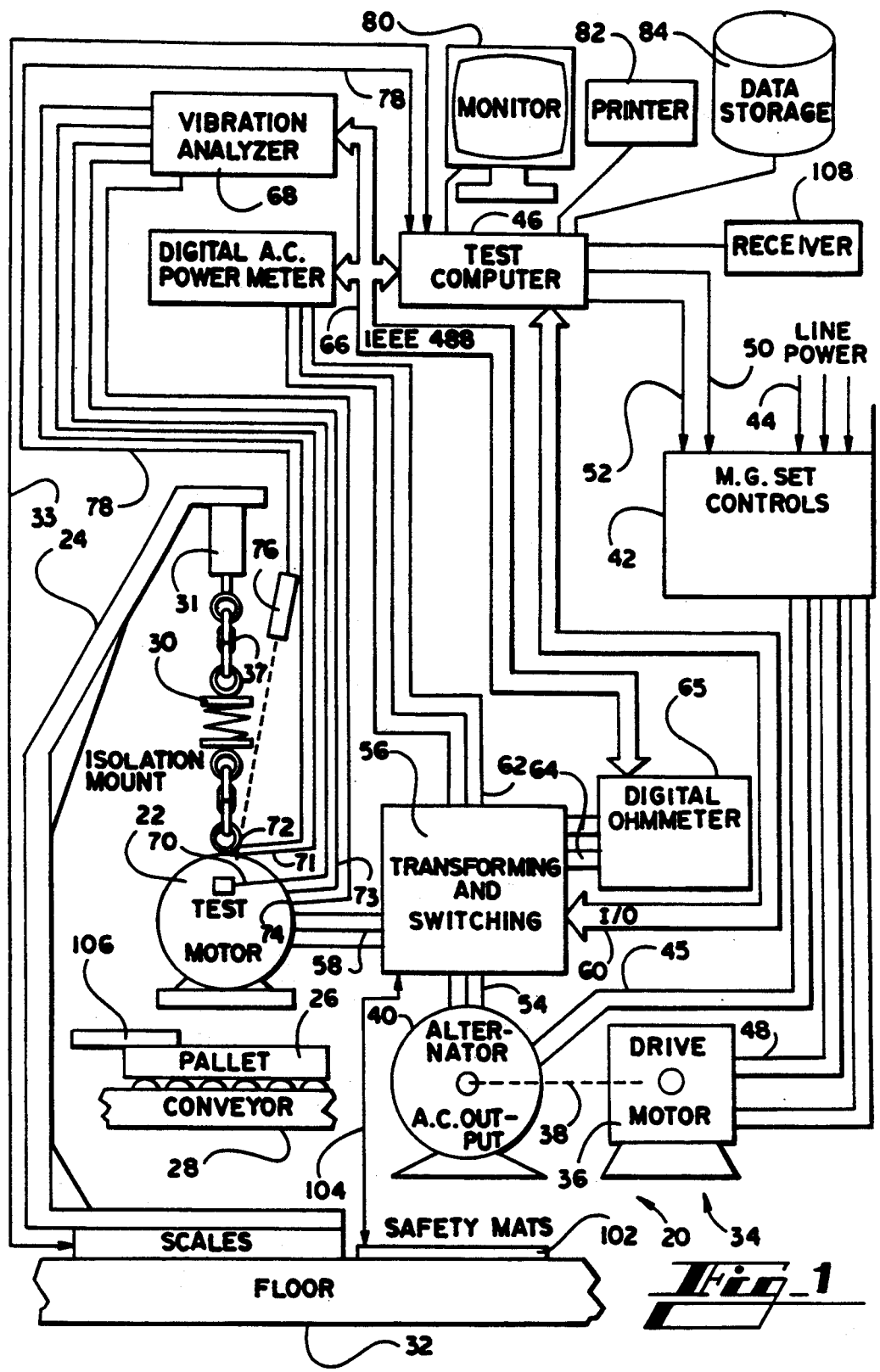
FIG. 1 is a block diagram showing apparatus in accordance with the present invention for testing three-phase a.c. electric motors on-line.

While the invention will be described in connection with a preferred embodiment and procedure, it will be understood that I do not intend to limit the invention to that embodiment or procedure. On the contrary, I intend to cover all alternatives, modifications, and equivalents as may be included within the spirit and scope of the invention as defined by the appended claims.

As previously noted, it is well known in the art to determine the performance parameters of a three-phase a.c. electric motor by connecting the motor to a dynamometer and monitoring the electrical input power and the mechanical output power for various loadings of the motor. Likewise, it is well known in the art to determine the performance parameters of a three-phase a.c. electric motor by using the "Equivalent Circuit Method" to calculate the performance parameters of a three-phase a.c. electric motor.

In connection with undertaking on-line testing of three-phase a.c. electric motors during production, it is highly desirable to test the motors without mechanically coupling the motor shaft to a dynamometer or any other instrumentality. Consequently, in order to determine the performance parameters of an electric motor during on-line tests, it is necessary first to determine off-line the stray load power loss for the particular motor design which is being tested. Next on-line measurements are taken of the d.c. resistance of the field windings, no load data points, and single-phase "locked rotor" data points. The single-phase data is then scaled so that it correlates with conventional locked rotor data for a three-phase a.c. electric motor. From the data gathered, including the scaled single-phase "locked rotor" data, the "Equivalent Circuit Method" is used to calculate the motor's performance parameters including efficiency, full load input current, full load input power, full load output power, full load output torque, speed, power factor, iron (hysteresis) power loss, friction and windage loss, the primary winding power loss, and secondary rotor power loss. The performance parameters then may be compared to predetermined limits.

With regard to the stray load power loss, such loss is power that is lost to heat or friction that cannot be characterized in accordance with any other identifiable power losses. The stray load power loss is determined in conventional fashion by dynamometer testing. The full load stray load power loss is a characteristic of a particular motor design, and as such, can be used as a constant in testing other motors on-line which have that same design. Therefore, in connection with the on-line testing of the present invention, the stray load power loss is predetermined through dynamometer testing and is used as a constant in connection with the on-line testing of the three-phase a.c. electric motor.

With respect to the d.c. resistance of the field windings at the design operating temperature, the test procedure for the present invention involves three measurements of the d.c. resistance, one at ambient temperature and two at elevated temperatures. From those measurements, the d.c. resistance at the design operating temperature can be calculated in conventional fashion as set out above.

The no load data points are determined in conventional fashion in accordance with the no load test described in Section 7 of *Japanese Standard JEC*-37 (1979). During the no load test, the motor runs with no mechanical load connected to the motor's shaft, and the electrical input power is measured over a range of voltages from about 30% up to about 125% of the rated a.c. input voltage for the motor.

Referring to FIG. 2, there is shown a graph which illustrates the results of the no load test on a three-phase a.c. electric motor. Electrical input power in watts is plotted along the y-axis and input voltage in volts is plotted along the x-axis. The line 10 is a plot of the total electrical input power versus the input voltage for a range of approximately 30% to 125% of the rated input voltage (e.g. rated voltage equals 360 volts a.c.; 30% equals 108 volts a.c.; and 125% equals 450 volts a.c.). The line 10 has been extrapolated below about 30% of rated voltage to intersect the y-axis at a point 12. Line 14 which intersects point 12 represents the constant value of the friction and windage power loss for the three-phase a.c. electric motor under test. The friction and windage power loss is essentially the mechanical losses resulting from bearing friction and windage (movement of air) from the rotating rotor and any attached cooling fan. The line 6 represents the primary winding power loss for the motor (i.e. the input current squared multiplied by the d.c. resistance of the primary windings). Line 8 represents the iron (hysteresis) power loss for the motor. The iron (hysteresis) power loss is equal to the total no load electrical input power (line 10), less the friction and windage power loss (line 14) and less the primary winding power loss at no load (line 6). The iron (hysteresis) power loss is a result of the hysteresis effect created by the changing electric fields in the metal of the electric motor.

FIG. 2 is used for illustrative purposes of the relationship between total no load power loss and the individual components thereof, i.e. the iron (hysteresis) power loss, the primary winding power loss and the friction and windage power loss. It is readily apparent that in connection with on-line testing of three-phase a.c. electric motors a mathematical representation of the graph, including the extrapolation of the data points to the y-axis (0 volts), can be accomplished by means of a general purpose digital computer.

Because coupling the rotor to an instrumentality to lock the rotor mechanically during on-line testing is considered impractical, it is necessary to provide an alternative test to the conventional locked rotor test of the *Japanese Standard JEC*-37 (1979). As an alternative to the conventional locked rotor test, a single-phase "locked rotor" test is undertaken in connection with the present invention. The single-phase "locked rotor" test uses a single-phase a.c. voltage source connected to the field windings instead of three-phase a.c. voltage source. The single-phase a.c. voltage does not produce the rotating electrical field that is produced by the three-phase a.c. voltage in the field windings. Consequently, the single-phase a.c. voltage does not produce any rotation of the rotor and in essence electrically locks the rotor.

With the rotor "locked" by the single-phase a.c. voltage, the single-phase a.c. voltage is set at the rated frequency, generally 60 Hz, and is adjusted to produce rated full load current in the field windings. The electrical input power and input voltage are then measured and recorded for a first data point at 60 Hz. The single-phase a.c. voltage is reset to a lower frequency, about 20 Hz, and is readjusted to produce rated full load current in the field windings. The electrical input power and input voltage are again measured and recorded for a second data point at the lower frequency of 20 Hz.

In order to establish a correlation between the results a single-phase "locked rotor" test using single-phase a.c. voltage and a conventional three-phase locked rotor test, a number of different three-phase a.c. electric motors were tested using the conventional locked rotor test procedure outlined in Section 6 of *Japanese Standard JEC*-37 (1979) for the three-phase locked rotor test. The same motors were then tested in the same fashion except that single-phase a.c. voltage was used to test the motors. In both cases, the electrical input voltage was set to produce the rated alternating current in the field windings. Two data points were established for the electrical input voltage source, one at the rated 60 Hz and the other at 20 Hz. At each data point, measurements were taken of the electrical input power, the input voltage, and the input current.

The results from linear regressions run on the raw data taken for both the input voltage and the input power at 60 Hz and 20 Hz showed to have an $R^2$ value higher than 0.90. This was considered a high enough correlation to calculate an average value for a conversion or scaling factor to convert the single-phase electrical input power and input voltage to equivalent three-phase electrical input power and input voltage which would have resulted had the conventional three-phase locked rotor test been undertaken. Particularly, the scaling factor for input power at all frequencies was found to have a value of 1.515 (single-phase input power times 1.515 equals three-phase electrical input power). In addition, the scaling factor for input voltage at all frequencies was found to have a value of 0.860 (single-phase input voltage times 0.860 equals three-phase input voltage). The scaled single-phase input power and scaled single-phase input voltage can then be used in place of the three-phase input power and three-phase input voltage from a conventional locked rotor test to calculate other performance parameters in accordance with the "Equivalent Circuit Method".

Having determined the scaling factors through cross-correlation between single-phase "locked rotor" tests and conventional three-phase locked rotor tests, a single-phase "locked rotor" test can be undertaken on-line without coupling the shaft of the motor under test to an outside instrumentality. Particularly, the on-line single-phase "locked rotor" test is undertaken by connecting a source of single-phase a.c. electric voltage to the field windings of the motor under test. The input voltage is set so that the input alternating current is at the rated value of input current for the motor under test. The a.c. input voltage is then set at the rated frequency of 60 cycles, and the electrical input power and electrical input voltage to the field windings are measured and recorded. The frequency of the a.c. voltage source is then reduced to approximately 20 Hz, and the voltage is adjusted to maintain the same rated input current. The electrical input power and the input voltage are then measured and recorded. Once the input power and input voltage data points have been recorded, they are scaled by the scaling factors, i.e. multiplied by 1.515 and 0.860 respectively. Using the scaled single-phase power data and single-phase voltage data at 60 Hz and 20 Hz, along with the primary winding d.c. resistance, stray load loss and the three no load data points, the full load performance parameters such as efficiency, full load input current, full load input power, full load output power, full load output torque, speed, power factor, iron (hysteresis) power loss, friction and windage loss, the primary winding power loss, and secondary rotor power loss can be determined and compared to predetermined limits.

In order to carry out the on-line efficiency testing and performance parameter determination described above, there is provided test apparatus 20 shown in FIG. 1 for testing a three-phase a.c. electric motor 22. The test apparatus 20 includes a test fixture 24 supported on scales 32. A lift cylinder 31 is suspended from the test fixture 24, and a chain 37 with a vibration isolation mount 30 is suspended from the lift cylinder 31. The motor 22 is delivered to the test fixture 24 on a pallet 26 by means of a conveyor 28.

The test apparatus 20 also includes a motor generator (M.G.) set 34 which includes a.c. drive motor 36 connected by a shaft 38 to a three-phase a.c. alternator 40. Three-phase a.c. power lines 44 are connected to M.G. set control 42. The M.G. set control 42 controls the a.c. alternator 40 through lines 45 in order to vary the a.c. voltage output on lines 54 from the alternator 40. In addition, the M.G. set control 42 controls the speed of the drive motor through lines 48 so that the output of the alternator 40 can provide a variable frequency a.c. voltage output. The M.G. set control 42 is controlled by computer 46 via control line 50, which controls the speed of the drive motor 36 (frequency), and control line 52, which controls the alternator field current (output volt level).

The test apparatus 20 also includes a transforming and switching panel 56 which couples the three-phase output of the alternator 40 on lines 54 to the motor 22 via lines 58. The transforming and switching panel 56 is controlled by means of IO bus 60 from test computer 46.

The test apparatus 20 also includes a digital a.c. power meter 63 connected to the transforming and switching panel 56 via lines 62. A digital ohmmeter 65 is connected to the transforming and switching panel 56 via lines 64. The power meter 63 and the ohmmeter 65 are controlled by the test computer 46 via IEEE 488 bus 66.

The test apparatus 20 also includes a vibration analyzer 68 which utilizes five vibrations sensors 70 (axial vibration), 71 and 72 (vertical vibration at each end of the motor), 73 and 74 (horizontal vibration at each end of the motor). The vibration analyzer 68 is controlled and communicates with the computer 46 via IEEE 488 bus 66.

The test apparatus 20 also includes a temperature sensor 76 which detects the temperature of the motor 22 and communicates that information to the test computer via line 78.

The test computer 46 includes a monitor 80, a printer 82 and a storage medium 84 for holding predetermined test parameters and for storing test data. In addition there is a safety mat 102 in the vicinity of the motor 22 so that when the operator is on the mat in the vicinity of the motor 22 the transforming and switching panel will be disabled via a signal on line 104.

In accordance with the present invention, the test apparatus 20 is used to test each and every motor on-line during the manufacturing process. The motor 22 to be tested is delivered to the test fixture 24 on a pallet 26 via conveyor 28. The pallet 26 has a computer/transmitter 106 attached thereto which contains a test parameter file. The test parameter file contains data about the motor 22, including the model of the motor, the stray load loss for that particular model, the field winding resistance, and the appropriate predetermined test limits for the motor. The computer/transmitter 106 transmits the data contained in a test parameter file to receiver 108 connected to computer 46.

Once the motor 22 is located adjacent the test fixture 24, the operator connects the input power lines 58 to the motor's leads and the vibration sensors 70, 71, 72, 73, and 74 to the housing of the motor 22. The motor is connected to the test fixture 24 by means of eyelet 110 and chain 37 with the isolation mount 30. The isolation mount 30 is used to assure that extraneous vibrations from the conveyor are not transmitted to the motor during vibration testing of the motor 22. After leaving the safety mat the operator starts the test procedure. The sequence for testing the motor 22 is as follows:

I. Computer set up
  A. Computer 46 reads the motor test parameter file from computer/transmitter 106 by means of receiver 108.
  B. Computer 46 arms the safety mat 102 by means of I/O bus 60 connected to transforming and switching panel 56. With the safety mat armed, any intrusions onto mat will cause the program to sequence to a restart/abort point in program.
  C. Computer 46 instructs lift cylinder 31 via I/O bus 60 to lift motor 22 off pallet. The motor weight is determined by scales 32, and the weight is transmitted to the computer 46 via line 33 and recorded.
  D. The field windings resistance is measured by digital ohmmeter 65 and supplied over IEEE 488 bus to the computer 46.
  E. The cold motor temperature is measured by temperature sensor 76 and supplied to the computer 46 via line 78 and recorded.
  F. If the windings resistance is not available in the parameter file, the computer 46 by means of I/O bus 60 and transforming and switching panel 56 switches the digital ohmmeter 65 into the circuit of the motor's field windings. The digital ohmmeter 65 measures the winding resistance and transmits the value to the computer 46 via IEEE 488 bus 66.
    1. If windings resistance is within predetermined limits for the motor temperature, the value is stored, and the test will continue.
    2. If windings resistance is outside predetermined limits for the motor temperature, the computer program will stop at a restart/abort point where the operator can restart or abort the test program.
    3. The computer 46 then removes the digital ohmmeter 65 from the circuit of the motor's field windings before continuing with test.

II. Single-phase locked rotor test
  A. Measurement of input power while motor is in a single-phase locked condition at rated input frequency (Hz) and at full load input current (amps).
    1. Computer 46 connects the alternator 40, through highest current transformer tap (C.T.) of transforming and switching panel 56, to one phase of the motor 22.
    2. In order to generate data for the first locked rotor test point, computer 46 sets the analog output levels on lines 50 and 52 to the approximately value needed for M.G. set 34 to produce the motor's rated input frequency (60 Hz) and to generate the output voltage required from the alternator 40 to produce the motor's rated full load input current in the field windings.
    3. Computer 46 instructs the digital power meter 63 via IEEE 488 bus 66 to measure the current and frequency of the electrical input power to the motor. The measured values of current and frequency are returned to the computer via IEEE 488 bus 66, and the computer 46 compares these values with test parameter ranges.
      a. If frequency and current of the electrical input power are in test parameter ranges, then:
        i. The computer 46 instructs the transforming and switching panel 56 to switch to the lowest C.T. range possible for accurate measurements of input current and electrical input power to the motor 22.
        ii. The computer 46 then instructs the digital power meter to measure input voltage, input current and electrical input power, and these values are stored by the computer 46 along with the frequency of the electrical input power to the motor 22.
      b. If frequency and/or current of the electrical input power are out of the test parameter ranges, the computer program will loop and adjust one or both of the analog output values on lines 50 and 52 to bring the measurements of the input current and the frequency of the electrical input power into range before finally storing the measurements of input voltage, input current, electrical input power, and the input frequency of the electrical input to the motor 22.
  B. Measurement of input power while motor is in a single-phase locked condition at approximately ¼ to ⅓ of rated input frequency and at full load input current.
    1. Computer 46 instructs the transforming and switching panel 56 to connect the M.G. set 34, through the highest C.T. tap, to one phase of the motor 22.
    2. In order to generate data for the second locked rotor test point, computer 46 sets the analog output levels on lines 50 and 52 to the approximately value needed for M.G. set 34 to produce ⅓ to ¼ the motor's rated input frequency (60 Hz) and to generate the voltage required from the alternator 40 to produce the motor's rated full load input current in the field windings.
    3. Computer 46 instructs the digital power meter 63 via IEEE 488 bus 66 to measure the current and frequency of the electrical input power to the motor. The measured values of current and frequency are returned to the computer via IEEE 488 bus 66, and the computer 46 compares these values with test parameter ranges.
      a. If frequency and current of the electrical input power are in test parameter ranges, then:

i. The computer 46 instructs the transforming and switching panel 56 to switch to the lowest C.T. range possible for accurate measurements of input current and electrical input power to the motor 22.

ii. The computer 46 then instructs the digital power meter to measure input voltage, input current and electrical input power simultaneously and these values are stored by the computer 46 along with the frequency ($\frac{1}{8}$ to $\frac{1}{4}$ of rated frequency) of the electrical input power to the motor 22.

b. If frequency and/or current of the electrical input power are out of the test parameter ranges, the computer program will loop and adjust one or both of the analog output values on lines 50 and 52 to bring the measurements of the input current and the input frequency of the electrical input power into range before finally storing the measurements of input voltage, input current, electrical input power, and the frequency ($\frac{1}{8}$ to $\frac{1}{4}$ of rated frequency) of the electrical input to the motor 22.

4. Computer 46 instructs transforming and switching panel 56 to disconnect motor 22 from M.G. set 34.

C. Measurement of field windings resistance to determine heat up of the field windings during determination of the first and second locked rotor test points.

1. Computer 46 instructs the transforming and switching panel 56 to switch the digital ohmmeter 65 into the circuit of the motor's field windings and measure warm motor windings resistance. The ohmmeter transmits the measure warm motor windings resistance back to computer 46 via IEEE 488 buss 66.

2. From the warm motor windings resistance measurement, the computer program then calculates the temperature rise between the first cold motor windings resistance measurement and the warm motor windings resistance measurement.

a. The windings temperature for the first locked rotor point is the motor's cold temperature measurement plus $\frac{1}{2}$ the temperature change calculated. This first calculated winding temperature value is stored with other data taken at the first locked rotor point above.

b. The winding temperature for the second locked rotor point is motor's cold temperature plus the total change calculated. This second windings temperature value is stored with other data taken at the second locked rotor point above.

3. Computer 46 then instructs transforming and switching panel 56 to remove the digital ohmmeter 65 from the field windings circuit of motor 22 before continuing with testing.

D. Measurement of electrical input power while motor is in a single-phase locked condition at rated input frequency and at rated input voltage.

1. Computer 46 instructs the transforming and switching panel 56 to connect the M.G. set 34, through highest C.T. tap, to one phase of the motor 22.

2. In order to generate data for the third locked rotor test point, computer 46 sets the analog output levels on lines 50 and 52 to the approximately value needed for M.G. set 34 to produce the motor's rated input frequency (60 Hz) and to produce the motor's rated input voltage from the alternator 40.

3. Computer 46 instructs the digital power meter 63 via IEEE 488 bus 66 to measure the voltage and frequency of the electrical input power to the motor. The measured values of voltage and frequency are returned to the computer via IEEE 488 bus 66, and the computer 46 compares these values with test parameter ranges.

a. If frequency and voltage of the electrical input power are in test parameter ranges, then:
      i. The computer 46 instructs the transforming and switching panel 56 to switch to the lowest C.T. range possible for accurate measurements of input current and electrical input power to the motor 22.
      ii. The computer 46 then instructs the digital power meter to measure input voltage, input current and electrical input power simultaneously and these values are stored by the computer 46 along with the frequency of the electrical input power to the motor 22.

b. If frequency and/or voltage of the electrical input power are out of the test parameter ranges, the computer program will loop and adjust one or both of the analog output values on lines 50 and 52 to bring the measurements of the input voltage and the input frequency of the electrical input power into range before finally storing the measurements of input voltage, input current, electrical input power and the input frequency of the electrical input to the motor 22.

4. At the end of the test, the measured electrical input power and measured input current are compared to predetermined limits, and the computer 46 gives the operator the options to retake this third locked rotor test point or fail the motor and print a failure report.

E. Measurement of electrical input power while motor is in a single-phase locked condition on a different phase at rated input frequency and at rated input voltage.

1. Computer 46 instructs the transforming and switching panel 56 to connect the M.G. set 34, through highest C.T. tap, to one phase of the motor 22.

2. In order to generate data for the fourth locked rotor test point, computer 46 sets the analog output levels on lines 50 and 52 to the approximately value needed for M.G. set 34 to produce the motor's rated input frequency (60 Hz) and to produce the motor's rated input voltage from the alternator 40.

3. Computer 46 instructs the digital power meter 63 via IEEE 488 bus 66 to measure the voltage and frequency of the electrical input power to the motor. The measured values of voltage and frequency are returned to the computer via IEEE 488 bus 66, and the computer 46 compares these values with test parameter ranges.

a. If frequency and voltage of the electrical input power are in test parameter ranges, then:
      i. The computer 46 instructs the transforming and switching panel 56 to switch to the lowest C.T. range possible for accurate measurements of input current and electrical input power to the motor 22.

ii. The computer 46 then instructs the digital power meter to measure input voltage, input current and electrical input power simultaneously and these values are stored by the computer 46 along with the frequency of the electrical input power to the motor 22.

b. If frequency and/or voltage of the electrical input power are out of the test parameter ranges, the computer program will loop and adjust one or both of the analog output values on lines 50 and 52 to bring the measurements of the input voltage and the input frequency of the electrical input power into range before finally storing the measurements of input voltage, input current, electrical input power and the input frequency of the electrical input to the motor 22.

4. At the end of the test, the measured electrical input power and measured input current are compared to predetermined limits, and the computer 46 gives the operator the options to retake this third locked rotor test point or fail the motor and print a failure report.

III. No load testing

A. Vibration levels and vibration frequencies are measured while the motor 22 runs with no load at a rated input voltage and rated input frequency.

1. Computer 46 instructs the transforming and switching panel 56 to connect the M.G. set 34, through highest C.T. tap, to all phases of the motor 22.

2. In order to generate data for the first no load test point, computer 46 sets the analog output levels on lines 50 and 52 to the approximately value needed for M.G. set 34 to produce the motor's rated input frequency (60 Hz) and to produce the motor's rated input voltage from the alternator 40.

3. Computer 46 instructs the digital power meter 63 via IEEE 488 bus 66 to measure the voltage and frequency of the electrical input power to the motor. The measured values of voltage and frequency are returned to the computer via IEEE 488 bus 66, and the computer 46 compares these values with test parameter ranges.

a. If frequency and voltage of the electrical input power are within test parameter ranges, the computer 46 instructs the vibration analyzer 68 to measure the frequency of and level of vibration for each sensor 70, 71, 72, 73, or 74 attached to the motor 22. The measured vibration values are returned to the computer vial IEEE 488 buss 66.

b. If frequency and/or voltage of the electrical input power are out of the test parameter ranges, the computer program will loop and adjust one or both of the analog output values on lines 50 and 52 to bring the measurements of the input voltage and the input frequency of the electrical input power into range before finally storing the measurements of vibration for the motor 22.

4. At the end of the test, the vibration values are compared to the predetermined limits, and the computer 46 gives the operator the options to retake this first no load test point or fail the motor and print a failure report.

B. Measurement of electrical input power while motor runs with no load at rated input frequency and at rated input voltage.

1. Computer 46 instructs the transforming and switching panel 56 to connect the M.G. set 34, through highest C.T. tap, to all phases of the motor 22.

2. In order to generate data for the second no load test point, computer 46 sets the analog output levels on lines 50 and 52 to the approximately value needed for M.G. set 34 to produce the motor's rated input frequency (60 Hz) and to produce the motor's rated input voltage from the alternator 40.

3. Computer 46 instructs the digital power meter 63 via IEEE 488 bus 66 to measure the voltage and frequency of the electrical input power to the motor. The measured values of voltage and frequency are returned to the computer via IEEE 488 bus 66, and the computer 46 compares these values with test parameter ranges.

a. If frequency and voltage of the electrical input power are within test parameter ranges, then:

i. The computer 46 instructs the transforming and switching panel 56 to switch to the lowest C.T. range possible for accurate measurements of input current and electrical input power to the motor 22.

ii. The computer 46 then instructs the digital power meter to measure input voltage for all phases of the motor, input current for all phases of the motor, and total electrical input power, and these values are stored by the computer 46 along with the frequency of the electrical input power to the motor 22.

b. If frequency and/or voltage of the electrical input power are out of the test parameter ranges, the computer program will loop and adjust one or both of the analog output values on lines 50 and 52 to bring the measurements of the input voltage and the input frequency of the electrical input power into range before finally storing the measurements of input voltage for all phases, input current for all phases, total electrical input power, and the input frequency of the electrical input to the motor 22.

4. At the end of the test, the measured electrical input power and measured input current are compared to predetermined limits, and the computer 46 gives the operator the options to retake this second no load test point or fail the motor and print a failure report.

C. Measurement of electrical input power while motor runs with no load at rated input frequency and at ½ rated input voltage.

1. Computer 46 instructs the transforming and switching panel 56 to connect the M.G. set 34, through highest C.T. tap, to all phases of the motor 22.

2. In order to generate data for the third no load test point, computer 46 sets the analog output levels on lines 50 and 52 to the approximately value needed for M.G. set 34 to produce the motor's rated input frequency (60 Hz) and to produce ½ the motor's rated input voltage from the alternator 40.

3. Computer 46 instructs the digital power meter 63 via IEEE 488 bus 66 to measure the voltage and frequency of the electrical input power to the motor. The measured values of voltage and frequency are returned to the computer via IEEE 488 bus 66, and the computer 46 compares these values with test parameter ranges.

a. If frequency and voltage of the electrical input power are within test parameter ranges, then:
      i. The computer 46 instructs the transforming and switching panel 56 to switch to the lowest C.T. range possible for accurate measurements of input current and electrical input power to the motor 22.
      ii. The computer 46 then instructs the digital power meter to measure input voltage for all phases of the motor, input current for all phases of the motor, and total electrical input power, and these values are stored by the computer 46 along with the frequency of the electrical input power to the motor 22.
   b. If frequency and/or voltage of the electrical input power are out of the test parameter ranges, the computer program will loop and adjust one or both of the analog output values on lines 50 and 52 to bring the measurements of the input voltage and the input frequency of the electrical input power into range before finally storing the measurements of input voltage for all phases, input current for all phases, total electrical input power, and the input frequency of the electrical input to the motor 22.

D. Measurement of electrical input power while motor runs with no load at rated input frequency and at 35% of rated input voltage.

1. Computer 46 instructs the transforming and switching panel 56 to connect the M.G. set 34, through highest C.T. tap, to all phases of the motor 22.
2. In order to generate data for the fourth no load test point, computer 46 sets the analog output levels on lines 50 and 52 to the approximately value needed for M.G. set 34 to produce the motor's rated input frequency (60 Hz) and to produce 35% of the motor's rated input voltage from the alternator 40.
3. Computer 46 instructs the digital power meter 63 via IEEE 488 bus 66 to measure the voltage and frequency of the electrical input power to the motor. The measured values of voltage and frequency are returned to the computer via IEEE 488 bus 66, and the computer 46 compares these values with test parameter ranges.

a. If frequency and voltage of the electrical input power are within test parameter ranges, then:
      i. The computer 46 instructs the transforming and switching panel 56 to switch to the lowest C.T. range possible for accurate measurements of input current and electrical input power to the motor 22.
      ii. The computer 46 then instructs the digital power meter to measure input voltage for all phases of the motor, input current for all phases of the motor, and total electrical input power, and these values are stored by the computer 46 along with the frequency of the electrical input power to the motor 22.
   b. If frequency and/or voltage of the electrical input power are out of the test parameter ranges, the computer program will loop and adjust one or both of the analog output values on lines 50 and 52 to bring the measurements of the input voltage and the input frequency of the electrical input power into range before finally storing the measurements of input voltage for all phases, input current for all phases, total electrical input power, and the input frequency of the electrical input to the motor 22.

IV. Test results

A. The test work up of collected data is performed by computer 46 to determine the load performance of the motor 22.

1. Windings resistance, windings temperature, single-phase locked rotor test data, and no load test data is used in an equivalent circuit calculation (Japanese Test Standard JEC-37 (1979)) to obtain load performances data.
   a. Performance load data includes electric input power, mechanical output torque, output speed, power factor, efficiency and horse power at each point calculated.
   b. At the end of the test, the full load performance values are compared to limits and when values are outside the limits the program gives the operator the option to retake certain test points or fail the motor and print a failure report.
2. In connection with calculating the efficiency of the motor 22, the single-phase locked rotor test data is first converted to three-phase locked rotor test data before being used to determine the secondary rotor power loss.
3. The three no load data points are used to separate friction and windage power loss from iron (hysteresis) power loss so that the values can be compared to separate limits.

We claim:

1. A method for testing a three-phase alternating current motor, having field windings and a rotor, without mechanically coupling the rotor to any instrumentality, the method comprising the steps of:
   a. connecting a source of single-phase alternating current, with a variable frequency, to the field windings of the motor;
   b. varying the frequency of the source of single-phase alternating current from a predetermined rated maximum frequency toward zero frequency;
   c. measuring and recording single-phase input power levels for various frequencies of input current;
   d. scaling the recorded single-phase input power levels by a scaling factor to produce scaled single-phase input power levels that correlate with conventional locked rotor input power levels resulting from a conventional locked rotor test using three-phase alternating current;
   e. calculating performance parameters for the motor using the scaled single-phase input power levels; and f. comparing the performance parameters to predetermined limits in order to determine whether the motor failed.

2. The method of claim 1, wherein the scaling factor is about 1.515.

3. A method for testing a three-phase alternating current motor, having field windings and a rotor, without mechanically coupling the rotor to any instrumentality, the method comprising the steps of:
   a. connecting a source of single-phase alternating current, with a variable frequency, to the field windings of the motor;
   b. varying the frequency of the source of single-phase alternating current from a predetermined rated maximum frequency toward zero frequency;
   c. measuring and recording single-phase input power levels for various frequencies of input current;
   d. scaling the recorded single-phase input voltage levels by a scaling factor to produce scaled single-phase input voltage levels that correlate with conventional locked rotor input voltage levels resulting from a conventional locked rotor test using three-phase alternating current;
   e. calculating performance parameters for the motor using the scaled single-phase input voltage levels; and
   f. comparing the performance parameters to predetermined limits in order to determine whether the motor failed.

4. The method of claim 3, wherein the scaling factor is about 0.860.

5. A method for testing a three-phase alternating current motor, having field windings and a rotor, without mechanically coupling the rotor to any instrumentality, the method comprising the steps of:
   a. connecting a source of single-phase alternating current, with a variable frequency, to the field windings of the motor;
   b. varying the frequency of the source of single-phase alternating current from a predetermined rated maximum frequency toward zero frequency;
   c. measuring and recording single-phase input power levels for various frequencies of input current;
   d. scaling the recorded single-phase input power levels by a power scaling factor to produce scaled single-phase input power levels that correlate with conventional locked rotor input power levels resulting from a conventional locked rotor test using three-phase alternating current voltages;
   e. measuring and recording single-phase input voltage levels for various frequencies of input current;
   f. scaling the recorded single-phase input voltage levels by a voltage scaling factor to produce scaled single-phase input voltage levels that correlate with conventional locked rotor input voltage levels resulting from a conventional locked rotor test using three-phase alternating current;
   e. calculating performance parameters for the motor using the scaled single-phase input power levels and scaled single-phase input voltage levels; and
   f. comparing the performance parameters to predetermined limits in order to determine whether the motor failed.

6. The method of claim 5, wherein the power scaling factor is about 1.515 and the voltage is about 0.860.

7. A method for determining performance parameters of a three-phase alternating current electric motor with a rated electrical input power and with a predetermined stray load loss and having field windings and a rotor, wherein the rotor is not mechanically coupled to any instrumentality, the method comprising the steps of:
   a. determining the direct current resistance of the field windings;
   b. connecting a source of three-phase alternating current, with a variable voltage, to the field windings of the motor, operating the motor at no load, and recording no load input power levels for various no load input voltage levels;
   c. connecting a source of single-phase alternating current, with a variable frequency, to the field windings of the motor and recording single-phase input power levels and single-phase input voltage levels for various input frequency levels;
   d. scaling the recorded single-phase input power levels to produce scaled single-phase input power levels that correlate with conventional locked rotor input power levels resulting from a conventional locked rotor test using three-phase alternating current;
   e. scaling the recorded single-phase input voltage levels to produce scaled single-phase input voltage levels that correlate with conventional locked rotor input voltage levels resulting from a conventional locked rotor test using three-phase alternating current;
   f. calculating the performance parameter of the motor from the stray load loss, the direct current resistance of the field windings, no load input power, the no load input voltage, the scaled single-phase input power, and the scaled single-phase input voltage; and
   g. comparing the performance parameters to predetermined limits in order to determine whether the motor failed.

8. The method of claim 7, wherein the single-phase input power and the scaled single-phase input power are related by a power scaling factor of 1.515 and the single-phase input voltage and the scaled single-phase input voltage are related by a voltage scaling factor of 0.860.

9. The method of claim 7, wherein the performance parameters include efficiency, full load current, full load input power, full load output power, full load output torque, speed, slip, power factor, friction and windage power loss, iron (hysteresis) power loss, secondary rotor power loss.

10. A test apparatus for testing a three-phase alternating current motor, having field windings and a rotor, without mechanically coupling the rotor to any instrumentality, the test apparatus comprising:
   a. a source of single-phase alternating current with a variable frequency;
   b. connector means for connecting the source of single-phase alternating current to the field windings of the motor;
   c. control means for varying the frequency of the source of single-phase alternating current from a predetermined rated maximum frequency toward zero frequency;
   d. measuring means for measuring single-phase input power levels for various frequencies of input current; and
   e. computer means connected to the measuring means for receiving the single-phase input power levels, multiplying the single-phase input power levels by a scaling factor to produce scaled single-phase input power levels that correlate with conventional locked rotor input power levels resulting from a conventional locked rotor test using three-phase alternating current, calculating performance parameters for the motor from the scaled single-phase input power levels, and comparing the performance parameters to predetermined limits in order to determine whether the motor failed.

11. The apparatus of claim 10, wherein the scaling factor is 1.515.

12. A test apparatus for testing a three-phase alternating current motor, having field windings and a rotor, without mechanically coupling the rotor to any instrumentality, the test apparatus comprising:
   a. a source of single-phase alternating current, with a variable frequency;
   b. connector means for connecting the source of single-phase alternating current to the field windings of the motor;
   c. control means for varying the frequency of the source of single-phase alternating current from a predetermined rated maximum frequency toward zero frequency;
   d. measuring means for measuring single-phase input voltage levels for various frequencies of input current; and
   e. computer means connected to the measuring means for receiving the single-phase input voltage levels, multiplying the single-phase input voltage levels by a scaling factor to produce scaled single-phase input voltage levels that correlate with conventional locked rotor input power levels resulting from a conventional locked rotor test using three-phase alternating current, calculating performance parameters for the motor from the scaled single-phase input voltage levels, and comparing the performance parameters to predetermined limits in order to determine whether the motor failed.

13. The apparatus of claim 12, wherein the scaling factor is 0.860.

14. A test apparatus for testing a three-phase alternating current motor, having field windings and a rotor, without mechanically coupling the rotor to any instrumentality, the test apparatus comprising:
   a. a source of single-phase alternating current, with a variable frequency;
   b. connector means for connecting the source of single-phase alternating current to the field windings of the motor;
   c. control means for varying the frequency of the source of single-phase alternating current from a predetermined rated maximum frequency toward zero frequency;
   d. measuring means for measuring single-phase input power levels for various frequencies of input current; and
   e. computer means connected to the measuring means:
      i. for receiving the single-phase input power levels and multiplying the single-phase input power levels by a power scaling factor to produce scaled single-phase input power levels that correlate with conventional locked rotor input power levels resulting from a conventional locked rotor test using three-phase alternating current and for receiving the single-phase input voltage levels; p2 ii. for receiving the single-phase input voltage levels and multiplying the single-phase input voltage levels by a voltage scaling factor to produce scaled single-phase input voltage levels that correlate with conventional locked rotor input voltage levels resulting from a conventional locked rotor test using three-phase alternating current;
      iii. for calculating performance parameters of the motor using the scaled single-phase input power levels and the scaled single-phase input voltage levels;
      iv. for comparing the performance parameters to predetermined limits in order to determine whether the motor failed.

15. A test apparatus for determining performance parameters of a three-phase alternating current electric motor with a rated electrical input power and with a predetermined stray load loss and having field windings and a rotor, wherein the rotor is not mechanically coupled to any instrumentality, the test apparatus comprising:
   a. resistance measuring means for determining the direct current resistance of the field windings;
   b. a source of three-phase alternating current, with a variable voltage;
   c. a source of single-phase alternating current, with a variable frequency;
   d. connector means for selectively connecting the source of three-phase alternating current and the source of single-phase alternating current to the field windings of the motor;
   e. no load measuring means for measuring the no load input power levels for various no load input voltage levels when the source of three-phase alternating current is connected to the field windings;
   f. single-phase measuring means for measuring the single-phase input power levels and single-phase input voltage levels for various frequencies of the single-phase alternating current when the source of single-phase alternating current is connected to the field windings;
   d. computer means connected to the resistance measuring means, to the no load measuring means and to the single-phase measuring means for receiving the direct current resistance, the no load input power levels, the single-phase input power levels, and the single-phase input voltage levels, wherein the computer multiplies the single-phase input power levels by a power scaling factor to produce scaled single-phase input power levels that correlate with conventional locked rotor input power levels resulting from a conventional locked rotor test using three-phase alternating current and multiplies the single-phase input voltage levels by a voltage scaling factor to produce scaled single-phase input voltage levels that correlate with conventional locked rotor input voltage levels resulting from a conventional locked rotor test using three-phase alternating current, wherein the computer calculates the performance parameter of the motor from the stray load loss, the direct current resistance of the field windings, no load input power, the no load input voltage, the scaled single-phase input power, and the scaled single-phase input voltage, and wherein the computer compares the performance parameters to predetermined limits in order to determine whether the motor failed.

16. The test apparatus of claim 15, wherein the power scaling factor is 1.515 and the voltage scaling factor is 0.860.

17. The method of claim 15, wherein the performance parameters include efficiency, full load current, full load input power, full load output power, full load output torque, speed, slip, power factor, friction and windage power loss, iron (hysteresis) power loss, secondary rotor power loss.

* * * * *